United States Patent [19]

Furuya

[11] Patent Number: 5,412,231
[45] Date of Patent: May 2, 1995

[54] SEMICONDUCTOR DEVICE HAVING ORGANICALLY DOPED STRUCTURE

[75] Inventor: Kazuhito Furuya, Yokohama, Japan
[73] Assignee: Tokyo Institute of Technology, Tokyo, Japan
[21] Appl. No.: 9,755
[22] Filed: Jan. 27, 1993
[30] Foreign Application Priority Data Jan. 29, 1992 [JP] Japan .................. 4-014209

[51] Int. Cl.⁶ .............. H01L 29/80; H01L 29/225
[52] U.S. Cl. ..................... 257/192; 257/194; 257/611
[58] Field of Search .............. 257/192, 194, 611

[56] References Cited

U.S. PATENT DOCUMENTS 4,613,541 9/1986 Isoda ........................ 428/212
4,882,609 11/1989 Schubert et al. ............ 257/194

FOREIGN PATENT DOCUMENTS 2576711 1/1986 France .
3278461 12/1991 Japan .
2185352 7/1987 United Kingdom .

OTHER PUBLICATIONS

Japanese Journal of Applied Physics, vol. 19, No. 5, May 1980, pp. L225–L227, "A New Field-Effect Transistor With Selectively Doped GaAs/n-Al$_x$Ga$_{1-x}$As Heterojunctions", Mimura et al.
Applied Physics Letters, vol. 33, No. 7, Oct. 1, 1978, pp. 665–667, "Electron Mobilities In Modulation-Doped Semiconductor Heterojunction Superlattices", Dingle et al.

Primary Examiner—Mark V. Prenty
Attorney, Agent, or Firm—Spencer, Frank & Schneider

[57] ABSTRACT

Mobility includes a semiconductor substrate, a non-doped layer applied on the semiconductor substrate, an electron supply layer applied on the non-doped layer, and a metal gate layer applied on the electron supply layer. The said electron supply layer has a structure in which impurity atoms serving as electron supply sources as well as scattering sources are arranged regularly, so that the structure is doped in an organized manner. Adjacent impurity atoms are separated from each other in a first direction, parallel to a direction in which an electron wave travels, by a first distance which is not larger than half of the wavelength of an electron wave. In a second direction which is perpendicular to the first direction, adjacent impurity atoms are separated by a second distance which is not larger than the wavelength of an electron wave. In a third direction which is perpendicular both to the first and second directions, adjacent impurity atoms are seperated by a third distance which is not larger than the wavelength of an electron wave. When the influence of the coherence length an electron cannot be ignored, the first, second and third distances are made not larger than half of the coherence length of an electron, and preferably not larger than a fifth of the coherence length.

29 Claims, 5 Drawing Sheets

FIG_1

FIG_2

FIG_7

FIG_8

FIG. 9

SEMICONDUCTOR DEVICE HAVING ORGANICALLY DOPED STRUCTURE

BACKGROUND OF THE INVENTION

FIELD OF THE INVENTION

The present invention relates to a semiconductor device comprising a semiconductor substrate, an undoped semiconductor layer applied on the semiconductor substrate, an electron supply layer applied on the undoped semiconductor layer and having impurity atoms doped therein, and a gate metal layer applied on the electron supply layer.

In the field of the electronics, there has been required a semiconductor device having a high operation speed for use in a wide band amplifier and a high speed computing or calculating circuit. There have been proposed various techniques for attaining the high speed semiconductor device. For instance, in a field effect transistor (FET) or a bipolar transistor, it has been known to decrease the transit time by shortening a gate length or base width. There has been further proposed to increase the electron mobility in FET by using a so-called modulation-doping.

In case of decreasing the transit time by shortening the gate length of FET, the transistor operation is carried out by decreasing a distance over which the electrons transit, i.e. a distance between a source region and a drain region. However, this solution has a limitation that the gate length could not be shortened to such an extent that the function of the gate could no more be attained. Moreover, a manufacturing technique for shortening the distance between the source region and the drain region has also a limitation. The above mentioned modulation-doping method has been developed in order to overcome such drawbacks.

The modulation-doping method has been described in L. Esaki and T. Tsu: Superlattice and negative differential conductivity in semiconductors, IBM J. Res. Develop., 14, 61 (1970). In this modulation-doping method, the operation speed of a transistor is made higher by suppressing the scattering by impurity atoms which is one of major factors for determining the electron mobility. Said impurity atoms are necessary for providing electrons in a device. In this case, the impurity atoms are collected near a potential barrier, and thus the impurity atoms are separated spatially from a region in which the electrons travel by providing a spacer layer so that the electrons are hardly scattered by the impurity atoms. In this manner, a carrier concentration of the impurity atoms can be increased without increasing the scattering due to the impurity atoms.

The effectiveness of the above mentioned modulation-doping method has been experimentally confirmed by R. Dingle, H. L. Stormer, A. C. Gossard and W. Eiegmann: Electron mobilities in modulation-doped semiconductor hetero junction superlattices: Appl. Phys. Lett., 33, 665 (1978). Further, in Mimura, S. Hiyamizu, T. Fujii and K. Nanbu: Jpn. Appl. Phys., 19, L225 (1980), there is described the application of the modulation-doping method to a high electron mobility transistor (HEMT).

In H. Sakaki: Scattering suppression and high-mobility effect of quantum-confined electrons in ultrafine semiconductor wire structures: Jpn. J. Appl. Phys., 19, L735 (1990), there is further proposed a method for suppressing the impurity atom scattering by decreasing an electron conduction channel to such a size which is comparable to a wavelength of an electron wave. In this solution, quantum wire structure having ultrafine size is formed in a semiconductor crystal such that the electrons passing through the quantum wire structure are liable not to be subjected to the impurity atom scattering. In this method, the scattering probability is greatly reduced due to the fact that when the conduction channel is formed by a single mode electron wave guide, the mode coupling to a reflecting direction mode is caused by the scattering, and in order to scatter the electrons into the reflecting direction, it is necessary to cause a large change in the momentum energy. This method has been proposed in accordance with the effect based on the quantum wave property of electrons.

In the above explained modulation-doping method, in order to realize a high electron mobility it is inevitable to provide the spacer layer between the conduction channel and the impurity layer serving as the electron supply layer such that the conduction channel and impurity layer are separated from each other by a sufficiently long distance, so that the scatter suppressing function is increased when the thickness of the spacer layer is increased.

In the field effect transistor, when the modulation-doped structure is provided between the source and drain regions, upon controlling the electron concentration near the hetero junction by applying a voltage (charge) to the gate electrode, the gate electrode and hetero junction may be considered to constitute a flat plate capacitance, so that it may be interpreted that charges having opposite polarity are stored at the opposing hetero junction. In this case, there is generated a so-called edge effect. That is to say, electric force lines generated from the gate electrode are diverged at the edge of the gate electrode, and therefore all the electric force lines are not terminated at the two dimensional electron gas (2DEG), but are ended at another portions. This edge effect results in that only a part of the charges applied to the gate electrode contributes the transistor operation, and thus it is necessary to increase an amount of the charges in order to attain a desired transistor operation. This results in the increase in the operation time of the transistor.

The edge effect is manifest when a ratio of the gate length to a distance between the gate and the hetero junction is made smaller, so that if the operation speed of the transistor is increased by reducing the gate length, it is necessary to shorten the distance between the gate and the hetero junction. However, as stated above the spacer layer has to be provided, and thus the distance between the gate and the hetero junction could not be made smaller than a thickness of the spacer layer. In this manner, the suppression of the impurity atom scattering and the shortening of the distance between the gate and the hetero junction are conflict with each other and the modulation-doping method has a limitation in increasing the operation speed of the transistor.

In the above mentioned quantum wire method, use is made of the single mode transmission, and thus the scattering can be suppressed. However, a current passing through the quantum wire structure is limited. That is to say, in the single mode transmission path, an amount of the current which can be carried by electron, i.e. Fermi particle is limited to about 80 $\mu$A per 1 eV and the conductivity of the channel is about 80 $\mu$mho. Therefore, in order to conduct a large amount of the current, it is necessary to increase the conductivity of the channel. Moreover, if the quantum wire structure is practically applied to the semiconductor device, it is necessary to develop a fine crystal technique and a manufacturing method for forming the ultrafine structure having a dimension nearly equal to a wavelength of an electron wave in a crystal grown surface.

SUMMARY OF THE INVENTION

The present invention has for its object to provide a novel and useful semiconductor device having a high operating speed, in which the above mentioned problems can be effectively solved by effectively utilizing the wave property of quantum mechanics of electrons or carriers.

According to the invention, a semiconductor device having a high operating property comprises:
  a semiconductor substrate having a main surface;
  an undoped layer provided on said main surface of the semiconductor substrate;
  an electron supply layer applied on said undoped layer and having an organically doped structure in which impurity atoms are doped regularly; and
  a metal gate layer applied on said electron supply layer.

In the semiconductor device according to the invention, the impurity atoms are doped in the electron supply layer in a nonrandom manner to form the organically doped structure in which the impurity atoms are doped regularly. In a preferable embodiment of the semiconductor device according to the invention, the impurity atoms are doped such that adjacent atoms viewed in a propagating direction in which an electron wave or carrier wave travels are separated from each other by a distance smaller than a half wavelength of the electron wave or a half coherence length of electron and adjacent atoms viewed in a direction perpendicular to said propagating direction are separated from each other by a distance not larger than the wavelength of the electron wave or the coherence length of electron. In another preferable embodiment of the semiconductor device according to the invention, impurity atoms viewed in the propagating direction as well as in the direction perpendicular to the propagating direction are separated from each other by a distance not larger than a half wave length of electron. In still another preferable embodiment of the semiconductor device according to the invention, the impurity atom doped layer is formed by stacking a plurality of delta-doped layers in a direction which is perpendicular to the propagating direction of the electron wave as well as perpendicular to the main surface of the semiconductor substrate. In the delta-doped layer, impurity atoms are arranged as a single layer. It should be noted that the delta-doped layer may be replaced by an equivalent thin layer. In a modified embodiment, a plurality of delta-doped layers or equivalent thin layers are stacked one another in a direction which is perpendicular to the propagating direction of the electron wave and parallel with the main surface of the semiconductor substrate.

According to the invention, the electron supply layer is formed by the organically doped structure in which the impurity atoms are doped regularly, a number of impurity atoms serves as the scattering centers and a number of scattered waves are superimposed one another to cancel out the scattered waves, so that the scattering is suppressed and the mobility is increased. In this manner, the operating speed of the semiconductor device according to the invention can be made extremely high.

EXPLANATION OF THE PREFERRED EMBODIMENTS

Figure 1:
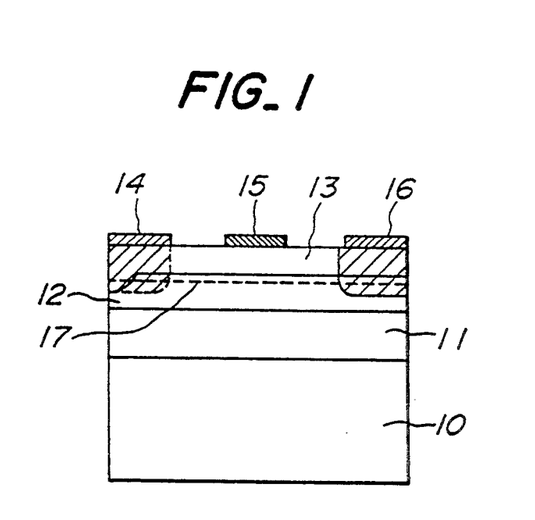
FIG. 1 is a cross sectional view showing the construction of HEMT in a first embodiment of the semiconductor device having the organically doped structure according to the invention.

FIG. 1 is a cross sectional view showing a first embodiment of the semiconductor device having the organically doped structure according to the invention. In the present embodiment, the organically doped structure is applied to a high electron mobility transistor (HEMT). In FIG. 1, a reference numeral 10 denotes a semiconductor substrate made of GaAs. On a main surface of the semiconductor substrate 10 there are successively provided a buffer layer 11, an undoped GaAs layer 12, and an electron supply layer 13. On the electron supply layer 13 there are formed source metal electrode 14, gate metal electrode 15 and drain metal electrode 16. The undoped GaAs layer 12 is made of highly purified GaAs material in which impurity atoms are removed as far as possible. The electron supply layer 13 is made of n type AlGaAs in which doner atoms are doped regularly in a manner explained later. Near a hetero junction formed between the undoped GaAs layer 12 and the electron supply layer 13 electrons are stored to form a two-dimensional electron gas (2DEG) 17. This two-dimensional electron gas 17 serves to form a two-dimensional channel. In the present embodiment, HEMT is formed by using the hetero junction of GaAs/AlGaAs, but the present invention is not restricted to such construction. For instance, HEMT may be formed by InGaAs/InAlAs or Si/SiGe. Further, the buffer layer 11 may be dispensed with as a case may be.

Figure 2:
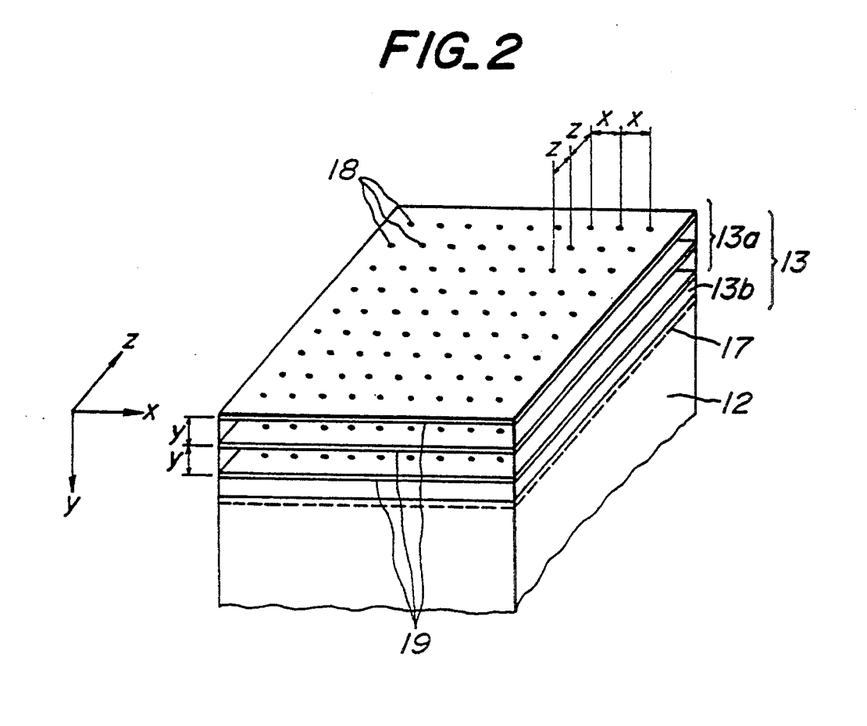
FIG. 2 is a perspective view illustrating the construction of the organically doped structure according to the invention.

According to the present invention, the electron supply layer 13 is formed by the organically doped structure 13a shown in FIG. 2. In the organically doped structure 13a, a number of impurity atoms 18 are arranged regularly as explained hereinbelow. In FIG. 2, a propagating direction in which an electron wave travels is denoted by z and mutually orthogonal directions which are perpendicular to the propagating direction z are represented by x and y. That is to say, the direction x is perpendicular to the propagating direction z and is parallel with the main surface of the semiconductor substrate 10, and the direction y is perpendicular to the propagating direction z and is perpendicular to the main surface of the semiconductor substrate. A distance between adjacent impurity atoms viewed in the propagating direction z is denoted by z and distances between adjacent impurity atoms viewed in the directions x and y are denoted by x and y, respectively for the sake of the simplicity. Then, according to the invention, the impurity atoms 18 are regularly arranged, while the following conditions are satisfied: $x<\lambda$, $y<\lambda$ and $z<\lambda/2$, wherein $\lambda$ is a wavelength of an electron wave. That is to say, the impurity atoms are regularly arranged in a three-dimensional manner such that the distance between adjacent atoms in the propagating direction z is made not larger than a half wavelength $\lambda$ of the electron wave and the distances x and y between successive impurity atoms viewed in the directions x and y both perpendicular to the propagating direction z are made not larger than the wavelength of the electron wave. When a coherence length of electron $\lambda_0$ is not sufficiently longer than the wavelength $\lambda$ of electron wave, the impurity atoms 18 are arranged regularly so as to satisfy conditions that $x<\lambda_0/2$, $y<\lambda_0/2$ and $z<\lambda_0/2$. Between the organically doped structure 13a and the hetero junction, there is arranged a spacer layer 13b for preventing the impurity atoms 18 from being introduced into the organically doped layer 13a.

In the present embodiment, the organically doped layer 13a is formed by stacking a plurality of delta-doped layers 19 one upon the other in the direction y which is perpendicular to the propagating direction z of the carrier wave and perpendicular to the main surface of the semiconductor substrate 10. Thus, each of the delta-doped layers 19 extends in parallel with the x–z plane which is in parallel with the main surface of the semiconductor substrate. According to the invention, a plurality of delta-doped layers 19 may be stacked in a direction which is in parallel with the propagating direction z, but is perpendicular to the main surface of the semiconductor substrate 10. That is to say, the delta-doped layers 19 may be arranged in parallel with the x-y plane. It should be noted that the delta-doped layer 19 is formed by arranging impurity atoms 18 regularly as a single layer. According to the invention, a very thin layer equivalent to the delta-doped layer may be used instead of the delta-doped layer.

The impurity atoms 18 can be arranged in the organically doped layer 13a accurately with the aid of the scanning tunnel electron microscope, in which respective impurity atoms can be handled one by one and can be placed at desired locations. The organically doped layer 13a may be formed also by utilizing the self-organization, but in this case the accuracy of the regularity of the impurity atom arrangement would be smaller than the case in which the impurity atoms are arranged one by one with the aid of the scanning tunnel electron microscope. The latter method utilizing the self-organization has been explained by T. Tatsumi, I. Hirosawa, T. Niino, H. Hirayama and J. Mizuki: Activation efficiency of a B $\sqrt{3}\times\sqrt{3}$/Si(111) structure covered with molecular beam deposited amorphous Si or SiO$_2$: NEC Microelectronics Lab. Miyazakidai, A. P. L. 57, (1), 2 Jul. 1990, 73. In this publication, when a single atom layer of boron is deposited on a clean surface of a silicon substrate in a high vacuum, boron atoms are entered into sites instead of silicon atoms by suitably selecting crystal surface and deposition temperature at regular positions of $\sqrt{3}\times\sqrt{3}$ and all borons are ionized by the replacement at the regular sites.

Figure 3:
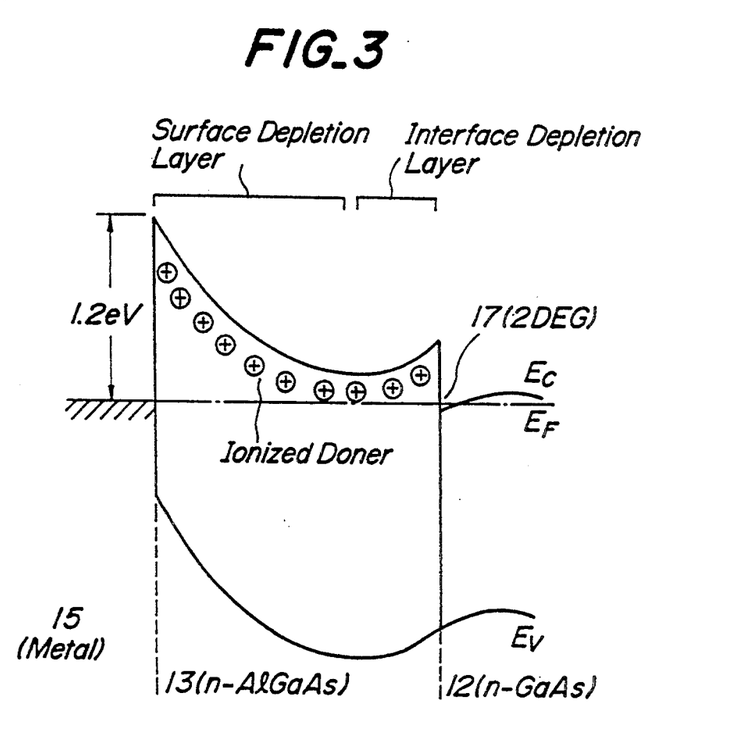
FIG. 3 is a schematic view for explaining the operation of the high electron mobility transistor.

Now the operational principle of HEMT according to the invention will be explained in detail with reference to FIGS. 3 to 6. In general, in the modulation-dope structure in which highly purified GaAs layer, n-AlGaAs layer and gate metal layer are stacked on a semi-insulating substrate, the n-AlGaAs layer is depleted by a surface depletion as well as the hetero junction depletion, and electrons in the n-AlGaAs are moved into the gate metal layer 15 and GaAs layer having a low energy. Electrons which have been moved into the GaAs layer are stored near the hetero junction to form a two-dimensional electron gas (2DEG) 17 as shown in FIG. 3. These electrons are spatially separated from the impurity ions in the bulk (n-AlGaAs layer), so that they are hardly scattered by the impurity atoms. In this stacked structure, the impurity distribution is abruptly changed in the direction of depth from the surface.

Figure 4:
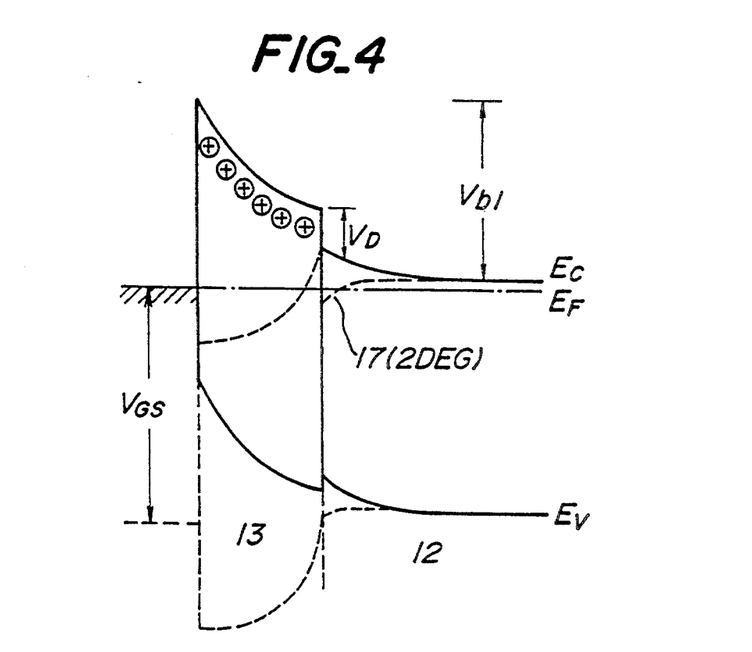
FIG. 4 is a schematic view for explaining the operation of the high electron mobility transistor.

If the n-AlGaAs layer is formed to have a thickness smaller than a thickness of the surface depletion layer, the hetero junction comes within the surface depletion layer and is depleted, and therefore when a positive potential is applied to the gate metal layer 15, the thickness of the surface depletion layer is decreased, and the two-dimensional electron gas is stored near the hetero junction as illustrated in FIG. 4 (enhancement mode). If the n-AlGaAs layer is formed to have a thickness which slightly larger than the thickness of the surface depletion layer, the surface depletion layer does not reach the hetero junction and the electrons are stored. When a negative potential is applied to the gate metal layer 15, the surface depletion layer is expanded and the two-dimensional electron gas 17 is depleted (depression mode). By utilizing one of the above explained two methods, the density of the 2DEG 17 can be controlled by the gate potential.

Therefore, when the above mentioned stacked structure is formed between the source and drain electrodes of HEMT, the conductivity of the channel between the source and the drain can be controlled by adjusting the gate potential. In this case, a time duration from an instant at which the signal is applied to the gate to an instant at which a current is initiated to flow between the source and the drain is the operation time of HEMT. This operation time is equal to a time during which the electron travels from the source to the drain. Therefore, in order to increase the operation speed of HEMT, it is essential to reduce the traveling time of electron.

Figure 5:
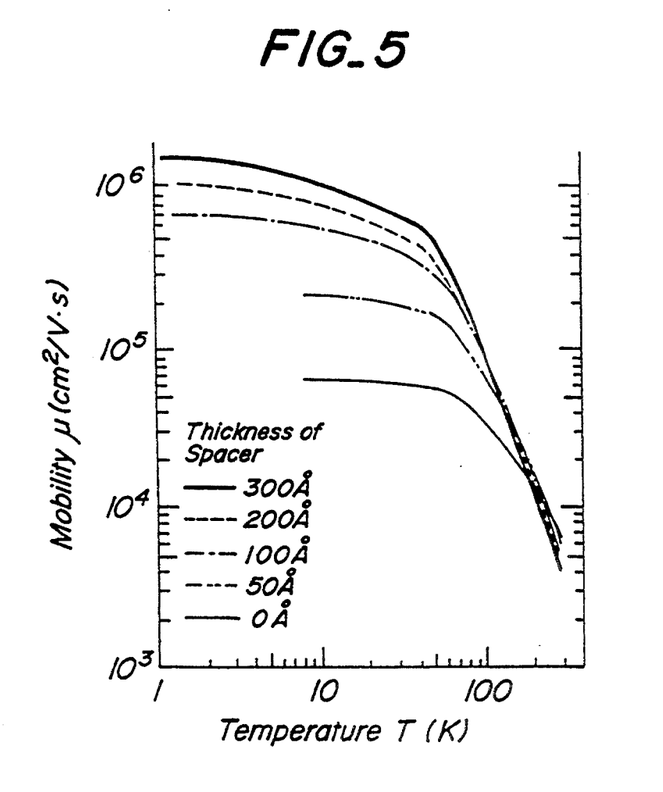
FIG. 5 is a graph representing the property of the high electron mobility transistor.
Figure 6:
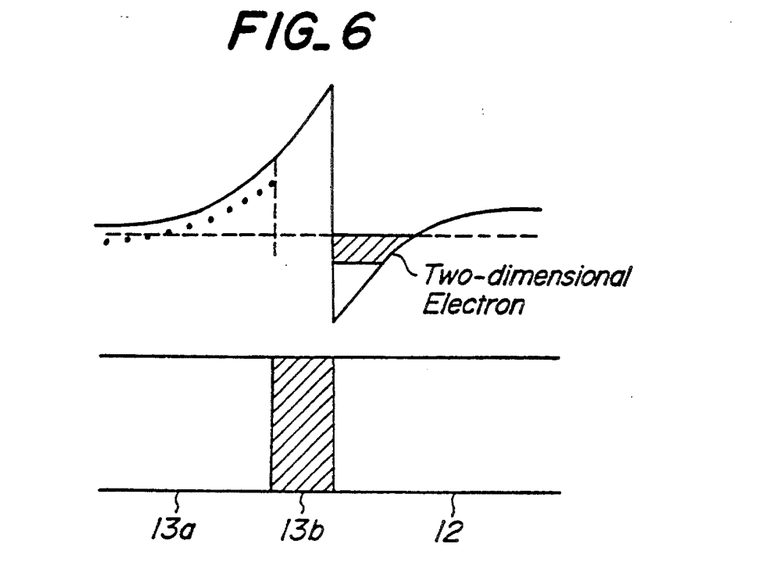
FIG. 6 is a schematic view showing the operational principle of the high electron mobility transistor.

However, the traveling speed of electron is limited by the scattering. A major cause of the scattering is an impurity scattering in a low temperature range, so that HEMT is liable to be subjected to the impurity scattering, because a spatial region in which the electrons travel is separated from the bulk ions for supplying the carriers. For instance, FIG. 5 shows a temperature dependency of the mobility which is one of parameters for denoting the decrease in the scattering. This graph has been originally shown in K. Hirakawa and H. Sakaki: Phys. Rev., B33, 8291 (1986). The increase in the mobility is represented by the decrease in the scattering. The mobility of GaAs at 300° K. is about 8500, but at the room temperature, the mobility is limited by the phonon scattering. When the temperature is decreased, the density of phonons is reduced and the mobility is increased. When the spacer layer is not provided, the increasing rate of the mobility becomes smaller from a temperature of 100° K. due to the function of the scattering by impurity ions.

Therefore, when the spacer layer is provided, the spatial region in which the electrons travel is made remote from the impurities and the impurity scattering can be suppressed. Therefore, the increasing rate of the mobility in dependence upon the decrease in the temperature can be maintained high. For instance, at a very low temperature, it is possible to realize a very high mobility more than 1000000.

The above explanation is a clear certification that in the modulation-doped structure, the scattering of electrons is suppressed and that the spacer layer is indispensable for suppressing the scattering by the impurity atoms.

In the modulation-doped structure, when the density of electrons near the hetero junction is controlled by applying the voltage (charge) to the gate metal layer, there is generated the edge effect as stated above, so that the decrease in the thickness of the spacer layer is required. Therefore, the suppression of the scattering and the decrease in the gate length have trade-off relation and the increase in the operation speed of the transistor having the modulation-doped structure is also limited. The present invention has been done in accordance with the recognition of the fact that the scattering is suppressed not by removing the scattering causes or sources, but by the interference due to the wave property of electrons.

In the organically doped structure according to the invention, the scattering can be suppressed although the scattering causes are existent near or even in the spatial region in which electrons travel, so that the organically doped structure is much more effective than the above mentioned modulation-doped structure. According to the invention, this principle for suppressing the scattering is applied to the arrangement of the impurity atoms in the electron supply layer in a semiconductor device.

Now the principle of suppressing the scattering according to the invention will be explained in a wave dynamic manner with reference to two cases, i.e. a first case in which the electron wave travels in a direction (z direction) along a plane in which the impurity atoms are regularly arranged and in a second case in which the electron wave travels in a direction (y direction) perpendicular to the above plane.

At first, the scattering of electron wave propagating along a plane on which scattering sources are arranged in a translational and symmetrical manner will be explained. When the scattering sources are arranged on the plane (y=0, i.e. x-z plane in FIG. 2), the following translational symmetry is established.

$$V(r + n_a a + n_b b) = V(r) \quad (1)$$

wherein:
r: vector for denoting positions of the scattering sources
V(r): scattering potential
a, b: translational vector
$n_a, n_b$: integer number Now it is assumed that the incident electron wave propagates in the z direction, then an effective mass equation may be represented by the following equation (2):

$$\nabla^2 \psi - \frac{2m}{\hbar^2} V(r)\psi = -\frac{2m}{\hbar^2} E\psi \quad (2)$$

wherein:
$\Delta^2$: laplacian
$\psi$: wave function of electron
m: effective mass
$\hbar$: Plank's constant/$2\pi$ A solution of this equation under no scattering source may be expressed by the following plane wave:

$$\psi(r) = \exp(ikz) \quad (3)$$

wherein:

$$k^2 = \frac{2m}{\hbar^2} E,$$

E being an energy.

Now it is assumed that a solution under the existence of scattering sources may be represented by the following equation.

$$\psi(r) = \exp(ikz) + \psi^{(s)}(r) \quad (4)$$

wherein $\psi^{(s)}(r)$ denotes a wave function. When the equation (4) is inserted into the equation (2), one may derive the following equation:

$$\nabla^2 \psi^{(s)}(r) + \frac{2m}{\hbar^2} E\psi^{(s)}(r) = -\frac{2m}{\hbar^2} V(r)\exp(ikz) \quad (5)$$

From this equation (5), it can be understood that the scattered wave is constituted by a number of spherical waves which are emitted isotropically from a number of wave sources whose amplitudes and phases are spatially distributed in the following manner.

$$\frac{2m}{\hbar^2} V(r)\exp(ikz) \quad (6)$$

Then, the wave function of the scattered wave may be calculated by the following integration:

$$\psi^{(s)}(r) = \int\int \frac{1}{r} \exp(ikr) \frac{2m}{\hbar^2} V(r')\exp(ikz')dr' \quad (7)$$

wherein r denotes a distance between a measuring point r and a point of integration variable r', and z' represents a z component of r'. It is now assumed that the measuring point r is sufficiently remote from a scattering source, so that the distance r may be approximated by a constant R. However, the distance r contained in the argument of the exponential function has to be treated much more precisely and is expressed by the following equation:

$$r \simeq R - x' \sin\theta \cos\phi - z' \cos\theta \quad (8)$$

wherein x' shows x component of r', $\theta$ denotes an angle between the vector r and an incident direction of the electron wave, and $\phi$ represents an angle between the x axis and a projection of the vector r which is projected onto the x-y plane. The distance r expressed by the equation (8) is inserted into the equation (7) and the integration is carried out. Then, there is derived the wave function represented by the following equation:

$$\psi^{(s)}(r) = \frac{1}{R} \exp(ikR) \frac{2m}{\hbar^2} \times \qquad (9)$$

$$\int \exp[-ikx'\sin\theta\cos\phi]X(x')dx' \times \int \exp[-ikz'(\cos\phi - 1)]Z(z')dz'$$

It should be noted that in the equation (9), V(x', z') is expressed by separating the variables X(x').Z(z'). From the equation (9), it can be understood that the amplitude of the scattered wave is constituted by a product of two factors and these factors are Fourier spectrum components of the scattering potential and correspond to the second and third factors of the equation (9), respectively. Thus, the scattered wave may be represented by the following equation:

$$\psi^{(s)}(r) = CF_x(-k \sin\theta\cos\phi)F_z(k(1-\cos\theta)) \qquad (10)$$

wherein C denotes a proportional constant. Now it is further assumed that the scattering potential is a periodic function and periods in the x and z directions are denoted by $d_x$ and $d_z$, respectively. Then, the spatial vector of the scattering potential has a value not equal to zero at spatial frequencies of integer multiples of $(2\pi/d_x)$ and $(2\pi/d_z)$. Therefore, there is produced a radiation in a direction $(\theta, \phi)$ which satisfies the following relation:

$$k \sin\theta \cos\phi = (2\pi/d_x)n_x \qquad (11)$$

$$k(1-\cos\theta) = (2\pi/d_z)n_z \qquad (12)$$

wherein $n_x$ and $n_z$ are integer numbers.

Therefore, when the following equations (13) and (14) are satisfied for all directions $(\theta, \phi)$, then there is no radiation, so that the scattering is not caused:

$$k \sin\theta \cos\phi < (2\pi/d_x) \ (n_x=1) \qquad (13)$$

$$k(1-\cos\theta) < (2\pi/d_z) \ (n_z=1) \qquad (14)$$

These equations may be rewritten into the following equations:

$$k < 2\pi/d_x \text{ or } \lambda > d_x \ (\sin\theta=1, \cos\phi=1) \qquad (15)$$

$$2k < 2\pi/d_z \text{ or } \lambda > 2d_z \ (\cos\phi=-1) \qquad (16)$$

wherein $\lambda$ is a wavelength of the electron wave.

The coherence length of electron and the suppression of scattering have such a relation that when a large number of scattering sources are existent within the coherence length of electron in the x and z directions, the scattering is effectively suppressed.

Next, a case will be analyzed in which the electron wave travels perpendicularly to the impurity arrangement plane. Now it is assumed that the impurity arrangement plane is denoted by a single plane(z=0, i.e. the xy plane). Then, an analysis similar to the above analysis can be performed in the following manner.

$$\psi^{(s)}(r) = \frac{1}{R} \exp(ikR) \frac{2m}{\hbar^2} \exp(ikz') \times \qquad (17)$$

$$\int \exp\{-ikx'\sin\theta\cos\phi\}X(x')dx' \times \int \exp\{-iky'\sin\theta\sin\phi\}Y(y')dy'$$

This equation may be rewritten in the following equation:

$$\psi^{(s)}(r) = C'F_x(-k \sin\theta \cos\phi)F_y(-k \sin\theta \sin\phi) \qquad (18)$$

wherein C' is a proportional constant. Now it is also assumed that the scattering potential is a periodic function and periods in the x and y directions are denoted by $d_x$ and $d_y$, respectively. Then, the spatial vector of the scattering potential has a value not equal to zero at spatial frequencies $(2\pi/d_x)n_x$ and $(2\pi/d_y)n_y$, wherein $n_x$ and $n_y$ are integer numbers. Therefore, there is produced a radiation in a direction $(\theta, \phi)$ which satisfies the following relation:

$$k \sin\theta \cos\phi = (2\pi/d_x)n_x \qquad (19)$$

$$k \sin\theta \sin\phi = (2\pi/d_y)n_y \qquad (20)$$

Therefore, when the following equations (21) and (22) are satisfied for all directions $(\theta, \phi)$, then there is no radiation, so that the scattering is not caused:

$$k \sin\theta \cos\phi < (2\pi/d_x) \ (n_x=1) \qquad (21)$$

$$k \sin\theta \sin\phi < (2\pi/d_y) \ (n_y=1) \qquad (22)$$

These equations may be rewritten into the following equations:

$$k < 2\pi/d_x \text{ or } \lambda > d_x \ (\sin\theta=1, \cos\phi=1) \qquad (23)$$

$$k < 2\pi/d_y \text{ or } \lambda > 2d_y \ (\sin\theta=1, \sin\phi=1) \qquad (24)$$

Also in the present case, the coherence length of electron and the suppression of scattering have such a relation that when a large number of scattering sources are existent within the coherence length of electron viewed in the x and y directions, the scattering is effectively suppressed.

From the above analyses it has been theoretically proved that the scattering of electrons is suppressed by arranging the impurity atoms regularly, while the above conditions are satisfied. It should be noted that the Bragg's reflection is not produced when the a distance between adjacent planes on which the impurity atoms are regularly arranged is not larger than a half of the electron wavelength $\lambda$ and the electron wavelength is about 50 nm under the thermal equilibrium condition, so that it is not necessary to take into account of the coherence length of electron as long as the coherence length of electron is sufficiently long with respect to the wavelength of electron wave. Therefore, in a practical numerical example, distances between adjacent impurity atoms in the x and y directions are set to a value not larger than 50 nm and a distance between adjacent impurity atoms in the z direction is set to a value not larger than 25 nm.

However, if the influence of the coherence length of electron is not ignored, it is necessary to arrange a plurality of scattering sources within the coherence length and only impurity atoms which are existent within the coherence length can have the effect of the regular arrangement, so that distances between adjacent impurity atoms in the x, y and z directions should be set to a value not larger than a half of the coherence length, preferably not larger than a fifth of the coherence length. Therefore, if the coherence length $\lambda_0$ is 100 nm, the distances between adjacent impurity atoms in the x, y and z directions are set to a value equal to or less than $\lambda_0/2=50$ nm, preferably equal to or smaller than $\lambda_0/5=20$ nm. These conditions could be sufficiently realized and the above mentioned conditions for the atom arrangement can be derived therefrom.

The effectiveness of the above explained organically doped structure according to the present invention may be also understood from the description of A. F. J. Levi, S. L. McCall and P.M. Platzman: Nonrandom doping and elastic scattering of carriers in semiconductors, AT & Bell Laboratories, Murray Hill, N.J. 07974 Received 31 Oct. 1988. In this publication, when an impurity atom doped layer is formed by stacking a plurality of delta-doped layers in which a single atom layer is provided or impurity atoms are concentrated into a thin film equivalent to the single atom layer, one another in a direction parallel with the carrier wave traveling direction or in a direction perpendicular to the carrier wave traveling direction, the impurity atoms are arranged in a nonrandom manner to a certain extent and the scattering is decreased. It has been confirmed by results of a simulation for the self-organical arrangement of the impurity atoms that the electron mobility of the partially ordered structure of impurity atoms becomes three times larger than that of randomly doped structure.

In the above mentioned publication, the impurity atoms are arranged regularly to a certain extent, but nothing is mentioned about the organically doped structure according to the invention in which the impurity atoms are arranged completely regularly. Therefore, the organically doped structure according to the invention could not be easily conceived from the above mentioned publication and according to the invention, it is possible to attain the electron mobility higher than that of the structure disclosed in said publication.

As explained above, according to the invention, the electron mobility of HEMT can be increased, and thus the operation speed of HEMT according to the invention can be made very high. In a practical semiconductor device, the increase in the electron mobility is not directly related to the increase in the operation speed, but it has been recognized that the operation speed of HEMT according to the invention tends to be made higher. It should be noted that the relation between the electron mobility and the operation speed has been analyzed in various ways, but has not been established completely. It has been generally considered that the operation speed depends upon the saturation speed rather than the electron mobility. Therefore, HEMT according to the present invention has a possibility for increasing the operating speed remarkably when the development and improvement in the semiconductor manufacturing technique will advance well.

Figure 7:
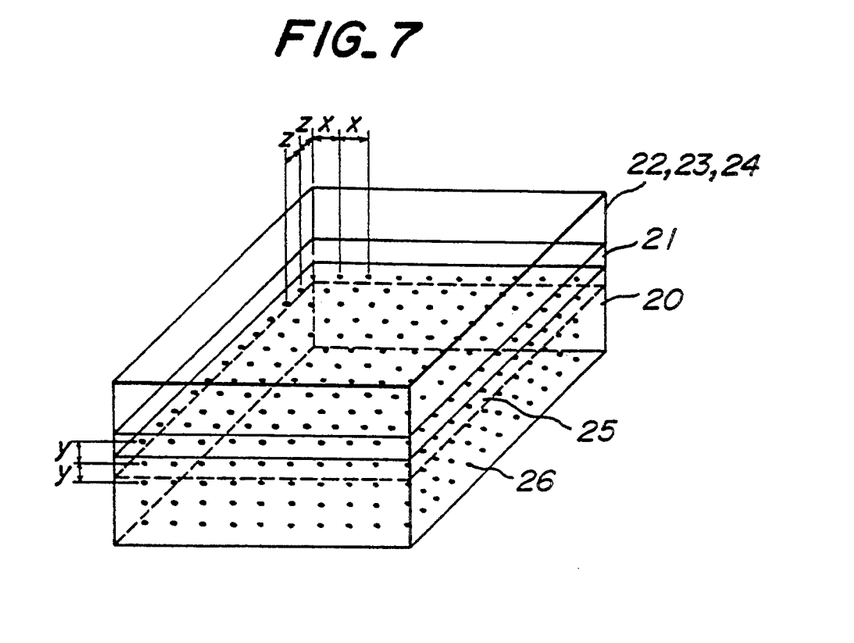
FIG. 7 is a perspective view depicting a MOS transistor in a second embodiment of the transistor device according to the invention.

FIG. 7 is a perspective view showing a main portion of a second embodiment of the semiconductor device having the organically doped structure according to the invention. In FIG. 7, a reference numeral 20 denotes a silicon substrate made of a silicon crystal layer. In the present embodiment, the organically doped structure is applied to MOS transistor. On the silicon substrate 20, there is applied an insulating layer 21 made of silicon oxide, and source metal layer 22, gate metal layer 23 and drain metal layer 24 are formed on the insulating layer 21. Into the upper surface of silicon substrate 20, impurity atoms 26 are doped regularly to form the organically doped structure which constitutes an electron supply layer 25 in the main surface of the silicon substrate 20.

By forming the organically doped structure as stated above, the MOS transistor of the present embodiment can have the same advantages as HEMT of the first embodiment. That is to say, the improvement of the electron mobility can be realized by suppressing the scattering of electrons.

Figure 8:
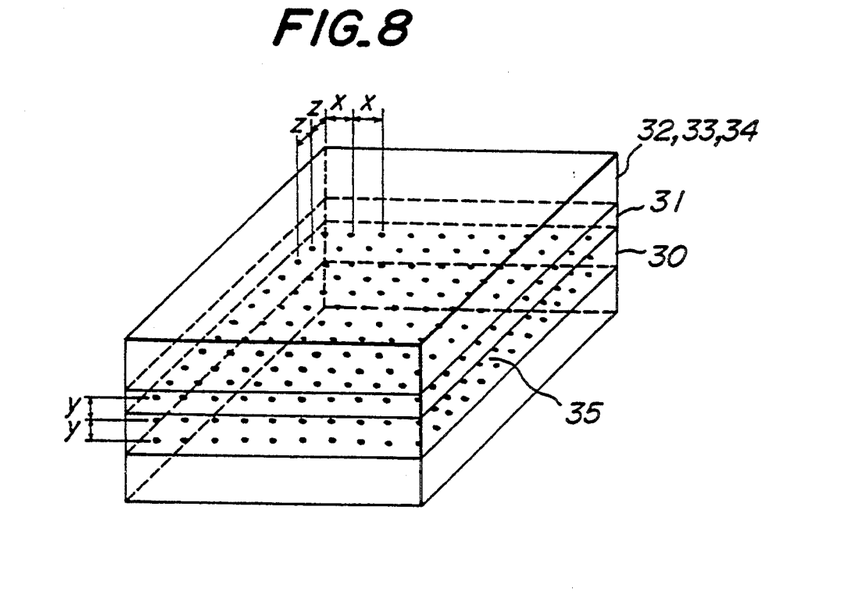
FIG. 8 is a perspective view illustrating a hetero junction transistor in a third embodiment of the semiconductor device according to the invention.

FIG. 8 is a schematic perspective view illustrating a third embodiment of the semiconductor device according to the invention. In FIG. 8, a reference numeral 30 represents a potential well channel. In the third embodiment, the organically doped structure is applied to a hetero junction transistor. On the potential well structure 30 there is provided an insulating layer 31, and source metal layer 32, gate metal layer 33 and drain metal layer 34 are applied on the insulating film 31. In the potential well structure 30, impurity atoms 35 are doped regularly to form the organically doped structure. Also in this embodiment, the electron mobility can be increased by suppressing the scattering of electrons.

As explained above in detail, according to the invention, the impurity atoms serving as the electron supply sources are doped regularly to form the organically doped structure by considering the quantum mechanics wave property of electron, so that the functions of the scattering sources constituted by the impurity atoms are canceled out and the scattering of electrons is effectively suppressed. Therefore, the electron mobility can be increased and the operation speed of the semiconductor device can be made very high.

Figure 9:
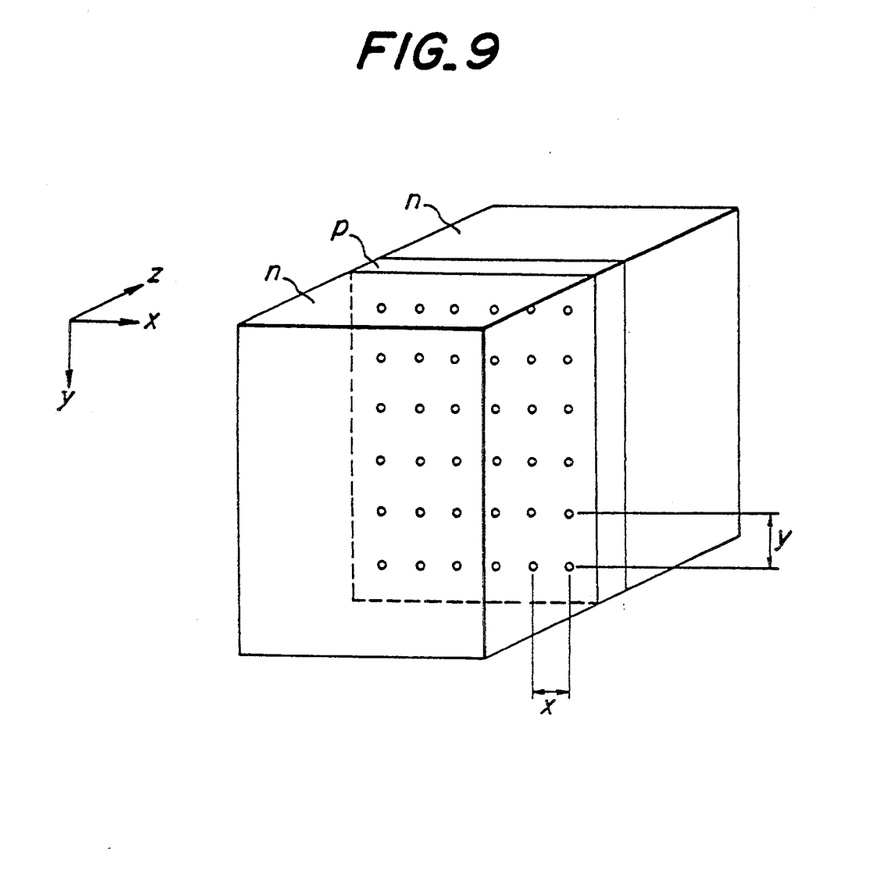
FIG. 9 is a perspective view showing schematically the construction of the bipolar transistor in a fourth embodiment of the semiconductor device according to the invention.

The present invention is not limited to the embodiments explained above, but many modifications and alternations may be conceived by those skilled in the art within the scope of the invention. For instance, the organically doped structure may be applied to a bipolar transistor as illustrated in FIG. 9. In FIG. 9, in a P-type layer P forming a very thin base region, there is formed at least one delta-doped layer in which impurity atoms are arranged regularly such that adjacent impurity atoms are separated from each other in the x and y directions by distances not larger than the wavelength of the electron wave. In case of providing a plurality of delta-doped layers in the z direction, i.e. the electron wave traveling direction, adjacent delta-doped layers are separated from each other in the z direction by a distance not larger than a half of the wavelength of the electron wave.

What is claimed is:

1. A semiconductor device, comprising:
    a semiconductor substrate having a main surface;
    an undoped layer provided above said main surface of the semiconductor substrate;
    an electron supply layer applied on said undoped layer, the electron supply layer including a structure that is doped in an organized manner so that impurity atoms are positioned regularly therein, the structure in said electron supply layer comprising at least one plane in which the impurity atoms are arranged regularly, said at least one plane extending in parallel with a first direction in which an electron wave travels, and wherein the impurity atoms are separated from each other in said first direction and in a second direction perpendicular to said first direction by first and second distances, respectively, which distances are determined in accordance with the wavelength of the electron wave; and a metal gate layer applied on the electron supply layer.

2. A semiconductor device, comprising:
a semiconductor substrate having a main surface;
an undoped layer provided above said main surface of the semiconductor substrate;
an electron supply layer applied on said undoped layer, the electron supply layer including a structure that is doped in an organized manner so that impurity atoms are positioned regularly therein, the structure in said electron supply layer comprising at least one plane in which the impurity atoms are arranged regularly, said at least one plane extending perpendicularly to a first direction in which an electron wave travels, and wherein the impurity atoms are separated from each other in a second direction which is perpendicular to said first direction and in a third direction which is perpendicular both to said first and second directions by second and third distances, respectively, which are determined in accordance with the wavelength of the electron wave; and
a metal gate layer applied on the electron supply layer.

3. A semiconductor device, comprising:
a semiconductor substrate having a main surface;
an undoped layer provided above said main surface of the semiconductor substrate;
an electron supply layer applied on said undoped layer, the electron supply layer including a structure that is doped in an organized manner so that impurity atoms are positioned regularly therein, the structure in said electron supply layer comprising at least one plane in which impurity atoms are arranged regularly, said at least one plane extending perpendicularly to a first direction in which an electron wave travels, and wherein the impurity atoms are separated from each other in a second direction which is perpendicular to said first direction and in a third direction which is perpendicular both to said first and second directions by second and third distances, respectively, which are determined in accordance with the coherence length of an electron; and
a metal gate layer applied on the electron supply layer.

4. A semiconductor device, comprising:
a semiconductor substrate having a main surface;
an undoped layer provided above said main surface of the semiconductor substrate;
an electron supply layer applied on said undoped layer, the electron supply layer including a structure that is doped in an organized manner so that impurity atoms are positioned regularly therein, the structure in said electron supply layer having the impurity atoms arranged such that adjacent impurity atoms are separated from each other in a first direction parallel with a direction in which an electron wave travels by a first distance which is not larger than half of the wavelength of the electron wave, in a second direction perpendicular to said first direction by a second distance which is not larger than the wavelength of the electron wave, and in a third direction perpendicular both to the first and second directions by a third distance which is not larger than the wavelength of the electron wave; and
a metal gate layer applied on the electron supply layer.

5. A semiconductor device, comprising:
a semiconductor substrate having a main surface;
an undoped layer provided above said main surface of the semiconductor substrate;
an electron supply layer applied on said undoped layer, the electron supply layer including a structure that is doped in an organized manner so that impurity atoms are positioned regularly therein, the structure in said electron supply layer having the impurity atoms arranged three-dimensionally such that adjacent impurity atoms are separated from each other in a first direction parallel with a direction in which an electron wave travels by a first distance which is not larger than half of the coherence length of an electron, in a second direction perpendicular to said first direction by a second distance which is not larger than half of the coherence length of the electron, and in a third direction perpendicular both to the first and second directions by a third distance which is not larger than half of the coherence length of the electron; and
a metal gate layer applied on the electron supply layer.

6. A semiconductor device, comprising:
a semiconductor substrate having a main surface;
an undoped layer provided above said main surface of the semiconductor substrate;
an electron supply layer applied on said undoped layer, the electron supply layer including a structure that is doped in an organized manner so that impurity atoms are positioned regularly therein, the structure in said electron supply layer comprising at least one plane in which the impurity atoms are arranged regularly, said at least one plane extending in parallel with a first direction in which an electron wave travels, and wherein the impurity atoms are separated from each other in said first direction and in a second direction perpendicular to said first direction by first and second distances, respectively, which are determined on the basis of the coherence length of an electron; and
a metal gate layer applied on the electron supply layer.

7. A semiconductor device, comprising:
a semiconductor substrate;
an undoped semiconductor layer above the substrate;
a further semiconductor layer above the undoped layer, the further semiconductor layer including a structure that is doped with impurity atoms which are positioned in a regular pattern, the structure in said further semiconductor layer comprising at least one plane in which the impurity atoms are arranged regularly, said at least one plane extending in parallel with a first direction in which an electron wave travels, and wherein the impurity atoms are separated from each other in said first direction and in a second direction perpendicular to said first direction by first and second distances, respectively, which distances are determined in accordance with the wavelength of the electron wave; and
a conductive gate layer above the further semiconductor layer.

8. A semiconductor device according to claim 1, wherein said first distance is set to a value not larger than half of the wavelength of the electron wave and said second distance is set to a value not larger than the wavelength of the electron wave.

9. A semiconductor device according to claim 1, wherein said first and second distances are set to values not larger than half of the coherence length of the electron.

10. A semiconductor device according to claim 1, wherein said structure in the electron supply layer is formed by stacking a plurality of delta-doped layers each of which is constituted by a single atom layer, said delta-doped layers being separated from each other in a third direction which is perpendicular both to the first and second directions by a distance not larger than the of the electron wave.

11. A semiconductor device according to claim 2, wherein said second and third distances are set to a value not larger than the wavelength of the electron wave.

12. A semiconductor device according to claim 3, wherein said second and third distances are set to values not larger than half of the coherence length of electron.

13. A semiconductor device according to claim 2, wherein said structure in the electron supply layer is formed by stacking a plurality of delta-doped layers each of which is constituted by a single-atom layer, said delta-doped layers being separated from each other in the first direction by a distance not larger than half of the wavelength of the electron wave.

14. A semiconductor device according to claim 1, wherein said semiconductor device is a high electron mobility transistor.

15. A semiconductor device according to claim 1, wherein said semiconductor device is a hetero junction transistor.

16. A semiconductor device according to claim 6, wherein said first and second distances are set to values not larger than a fifth of the coherence length of the electron.

17. A semiconductor device according to claim 6, wherein said structure in the electron supply layer is formed by stacking a plurality of delta-doped layers each of which is constituted by a single atom layer, said delta-doped layers being separated from each other in a third direction which is perpendicular both to the first and second directions by a distance not larger than the coherence length of the electron.

18. A semiconductor device according to claim 6, wherein said structure in the electron supply layer is formed by stacking a plurality of thin, delta-doped layers, said delta-doped layers being separated from each other in a third direction which is perpendicular both to the first and second directions by a distance not larger than the coherence length of the electron.

19. A semiconductor device according to claim 1, wherein said structure in the electron supply layer is formed by stacking a plurality of thin, delta-doped layers, said delta-doped layers being separated from each other in a third direction which is perpendicular both to the first and second directions by a distance not larger than the wavelength of the electron wave.

20. A semiconductor device according to claim 3, wherein said second and third distances are set to values not larger than a fifth of the coherence length of the electron.

21. A semiconductor device according to claim 3, wherein said structure in the electron supply layer is formed by stacking a plurality of delta-doped layers each of which is constituted by a single-atom layer, said delta-doped layers being separated from each other in the first direction by a distance not larger than half of the coherence length of the electron.

22. A semiconductor device according to claim 3, wherein said structure in the electron supply layer is formed by stacking a plurality of thin, delta-doped layers, said delta-doped layers being separated from each other in the first direction by a distance not larger than half the coherence length of the electron.

23. A semiconductor device according to claim 2, wherein said structure in the electron supply layer is formed by stacking a plurality of thin, delta-doped layers, said delta-doped layers being separated from each other in the first direction by a distance not larger than half of the wavelength of the electron wave.

24. A semiconductor device according to claim 6, wherein said semiconductor device is formed as a high electron mobility transistor.

25. A semiconductor device according to claim 6, wherein said semiconductor device is formed as a heterojunction transistor.

26. The semiconductor device of claim 7, wherein the further semiconductor layer touches the undoped layer.

27. The semiconductor device of claim 7, wherein the regular pattern is such that adjacent impurity atoms are separated from each other in a first direction parallel with a direction in which an electron wave travels by a first distance which is not larger than half of a wavelength of the electron wave, in a second direction perpendicular to the first direction by a second distance which is not larger than the wavelength of the electron wave, and in a third direction perpendicular both to the first and second directions by a third distance which is not larger than the wavelength of the electron wave.

28. The semiconductor device of claim 7, wherein the regular pattern is such that adjacent impurity atoms are separated from each other in a first direction parallel with a direction in which an electron wave travels by a first distance which is not larger than half of the coherence length of an electron, in a second direction perpendicular to the first direction by a second distance which is not larger than half of the coherence length of the electron, and in a third direction perpendicular both to the first and second directions by a third distance which is not larger than half of the coherence length of the electron.

29. A semiconductor device according to claim 5, wherein said first, second and third distances are set to values which are not larger than a fifth of the coherence length of an electron.

* * * * *